(12) United States Patent
Ying et al.

(10) Patent No.: US 7,192,794 B2
(45) Date of Patent: Mar. 20, 2007

(54) FABRICATION METHOD OF TRANSPARENT ELECTRODE ON VISIBLE LIGHT-EMITTING DIODE

(75) Inventors: Tse-Liang Ying, Tainan (TW); Shi-Ming Chen, Tainan (TW)

(73) Assignee: Epitech Technology Corporation, Tainan County (TW)

( * ) Notice: Subject to any disclaimer, the term of this patent is extended or adjusted under 35 U.S.C. 154(b) by 103 days.

(21) Appl. No.: 10/938,309

(22) Filed: Sep. 9, 2004

(65) Prior Publication Data

US 2006/0035398 A1  Feb. 16, 2006

(30) Foreign Application Priority Data

Aug. 11, 2004  (TW) .............................. 93124113 A

(51) Int. Cl.
*H01L 21/00*  (2006.01)

(52) U.S. Cl. .......................... 438/22; 438/48; 438/956; 257/79; 257/86

(58) Field of Classification Search .................. 438/22, 438/48
See application file for complete search history.

(56) References Cited

U.S. PATENT DOCUMENTS 6,693,352 B1 *  2/2004  Huang et al. ................ 257/743

\* cited by examiner

*Primary Examiner*—Long Tran
(74) *Attorney, Agent, or Firm*—Michael A. Glenn; Glenn Patent Group

(57) ABSTRACT

A method for forming a transparent electrode on a visible light-emitting diode is described. A visible light-emitting diode element is provided, and the visible light-emitting diode element has a substrate, an epitaxial structure and a metal electrode. The metal electrode and the epitaxial structure are located on the same side of the substrate, or located respectively on the different sides of the substrate. An ohmic metal layer is formed on a surface of the epitaxial structure. The ohmic metal layer is annealed. The ohmic metal layer is removed to expose the surface of the epitaxial structure. A transparent electrode layer is formed on the exposed surface. A metal pad is formed on the transparent electrode layer.

11 Claims, 12 Drawing Sheets

FABRICATION METHOD OF TRANSPARENT ELECTRODE ON VISIBLE LIGHT-EMITTING DIODE

FIELD OF THE INVENTION

The present invention relates to a light-emitting diode (LED), and more particularly, to the method for manufacturing an improved electrode on a visible LED.

METHOD FOR BACKGROUND OF THE INVENTION

An LED is a p-n junction diode that can emit ultraviolet, visible and infrared light. A visible LED is usually used as the light source of the operation panel for electric appliances such as, for example, the light source of a camera with an auto-focus function and the light source of a bar code reader.

A visible LED is an LED that can emit visible light with a wavelength of 400 nm to 700 nm. A visible LED can be manufactured by utilizing III-V semiconductor materials having energy gaps within the range of 1.36 eV to 3.26 eV, such as GaP, $Ga_{1-x}Al_xAs$, GaN, and $GaAs_{1-y}P_y$.

The brightness of a visible LED is the most important quality for use thereof. Some manufacturing steps can be performed to enhance the brightness of a visible LED, such that a transparent electrode layer is added before forming a metal electrode during the manufacturing process of a visible LED. Suitable materials for the transparent electrode layer are used, such as InO, SiO, ZnO, or ITO (Indium Tin Oxide). The transparent electrode layer can be used not only to form ohmic contact between the LED devices, but also to diffuse the electricity flowing therethrough to enhance the brightness of the visible LED. However, the conventional procedure for forming the transparent electrode layer, by depositing suitable materials directly on the LED element, forms a proper ohmic contact between the LED devices only with difficulty.

To resolve the problem, some III-V semiconductor materials, such as GaAs, GaP, or GaAsP have been used to form a p-type ohmic contact film with heavy doping between the LED element and the transparent electrode layer to reduce the resistance of the transparent electrode layer. However, when GaAs is doped into the AlGaInP-based LED element to form the ohmic contact film, most of the visible light emitted from the LED element can be absorbed by the GaAs because the energy gap of the GaAs, about 1.35 eV, is less than 1.63 eV to 3.26 eV, which is the energy gap of visible light. Although using other materials avoids the energy gap problem, electric resistance still increases.

On the other hand, a hybrid superlattice structure of the contact layer of the LED element has been used as an alternative way to reduce the electric resistance of the transparent electrode layer. However, the structure still absorbs visible light.

A problem in this technique is that it can be difficult to fabricate a transparent electrode with low resistance that also does not absorb visible light.

SUMMARY OF THE INVENTION

Therefore, the objective of the present invention is to provide a transparent electrode of a visible LED, where the transparent electrode has a low resistance and does not absorb visible light absorption. An improved manufacturing method is also provided to resolve the drawback of the prior art, and an improved visible LED with high brightness is thereby fabricated.

According to the aforementioned objectives, the present invention provides a manufacturing method for fabricating an improved transparent electrode of a visible LED. The manufacturing method comprises several steps. First, an LED element is formed by a prior technique. Then, an ohmic metal layer is deposited on the LED element. Before removing the ohmic metal layer, a thermal annealing is performed on the ohmic metal layer, such that the ohmic metal ion can diffuse onto the surface of the LED element. An etching step is conducted for removing the ohmic metal layer. A transparent electrode layer is deposited onto the surface of the LED element. Finally, a metal pad is formed on the transparent electrode to complement an LED device.

Accordingly, the problems of prior art can be overcome by reducing the resistance between the transparent electrode and the LED element, and through the present invention an improved visible LED device with a high degree of brightness can be obtained simultaneously.

BRIEF DESCRIPTION OF THE DRAWINGS

The foregoing aspects and many of the attendant advantages of this invention will become more readily appreciated as the same becomes better understood by reference to the following detailed description, when taken in conjunction with the accompanying drawing, wherein.

DETAILED DESCRIPTION OF THE PREFERRED EMBODIMENT

The present invention discloses a manufacturing method for fabricating a transparent electrode of a visible LED.

The present invention is characterized by the thermal diffusion of ohmic metal ions to the surface of the LED element to reduce the resistance between the transparent electrode and the LED element. In order to make the illustration of the present invention more explicit and complete, the following description is stated with reference to some preferred embodiments of the present invention.

According to present invention, an LED element is formed by a prior technique. Then, an ohmic metal layer is deposited over the LED element. Before removing the ohmic metal layer, a thermal annealing step is performed on the ohmic metal layer, such that the ohmic metal ion can diffuse onto the surface of the LED element. An etching step is conducted for removing the ohmic metal layer. A transparent electrode layer is deposited onto the surface of the LED element. Finally, a metal pad is formed on the transparent electrode to complement an LED device.

Prior techniques can be used for forming the LED element; for example, an epitaxial structure is grown on a substrate by metal organic chemical vapor deposition (MOCVD). The material of the epitaxial structure may be III-V semiconductor materials having energy gaps of 1.63 eV to 3.26 eV, such as GaP, $Ga_{1-x}Al_xAs$, GaN, and $GaAs_{1-y}P_y$.

Figure 1:
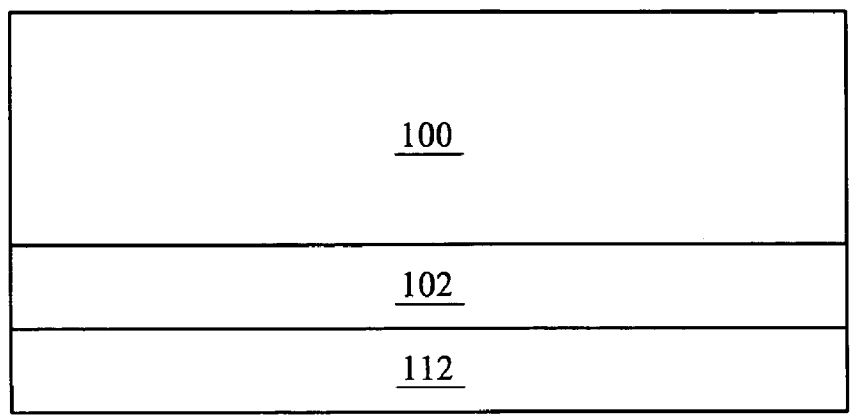
FIGS. 1–1C illustrate a series of cross-sectional structures showing the manufacturing processes for fabricating a transparent electrode of a visible LED in accordance with the first embodiment of the present invention.
Figure 1A:
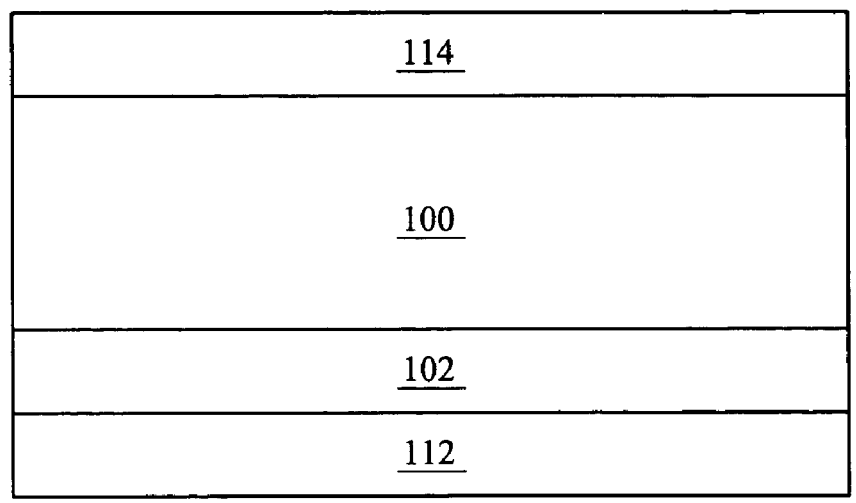
Figure 1B:
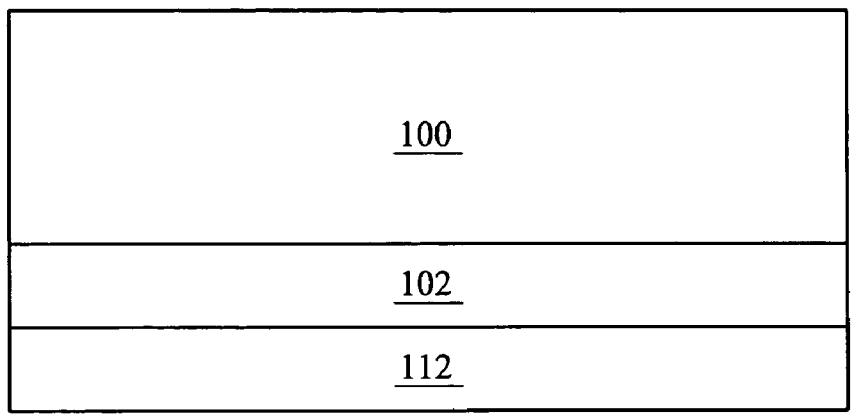
Figure 1C:
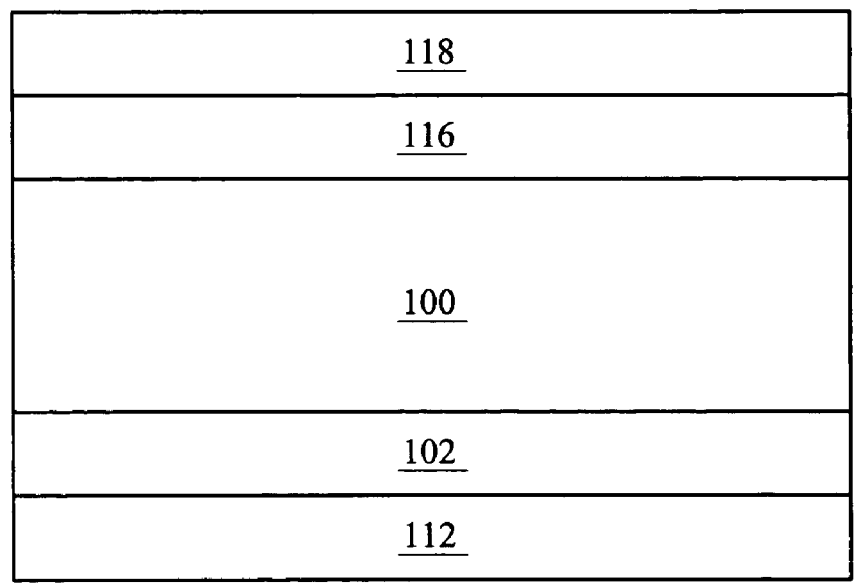

FIGS. 1–1C illustrate a series of cross-sectional structures showing the manufacturing processes for fabricating a transparent electrode of a visible LED in accordance with the second embodiment of the present invention. FIG. 1A illustrates an AlGaInP element comprising a substrate 102 and an epitaxial structure 100 over the substrate 102. Preferably, the substrate 102 is made of n-type GaAs. In the embodiment, the epitaxial structure 100 comprises a buffer layer, an n-type cladding layer, an active layer, and a p-type cladding layer, deposited in sequence. The preferable material of the buffer layer is n-type GaAs. The preferable material of the n-type cladding layer is n-type GaAs with a wider energy gap. The preferable material of the active layer is n-type GaAs with a narrower energy gap or n-type GaAs with multiple quantum wells (MQW). The preferable material of the buffer layer is n-type GaAs. The preferable material of the p-type cladding layer is p-type GaAs with a wider energy gap.

The LED element further comprises a metal electrode 112. The preferable metal material 112 of the electrode is Ti, Al, or GeAu alloy. In the first embodiment of present invention, the metal electrode 112 and the epitaxial structure 100 are formed respectively on opposite sides of the substrate 102.

FIG. 1A illustrates a cross-sectional structure of the LED element after the ohmic metal layer 114 is formed over the epitaxial structure 100. The process, such as thermal evaporation, electron enhanced evaporation, or sputtering deposition may be used to deposit ohmic metal over the epitaxial structure 100. The preferred material of the ohmic metal may be PdIn, Zn, Ni, Au, or AuBe alloy. The preferred thickness of the ohmic metal layer 114 may be greater than 10 Å. In the first embodiment of present invention, the metal electrode 112 and the ohmic metal layer 114 are formed respectively on opposite sides of the epitaxial structure 100.

Then, a thermal annealing step is conducted on the ohmic metal layer, such that the ohmic metal ion can diffuse onto the surface of the epitaxial structure 100. In the first embodiment of present invention, the annealing temperatures are, for example, 200 to 700° C., and more preferably to 300 to 500° C. After the annealing step, an etching step is conducted for removing the ohmic metal layer to form the structure illustrated in FIG. 1B.

FIG. 1C illustrates a cross-sectional structure of the LED element after the transparent electrode layer 116 is formed over the epitaxial structure 100. After removal of the ohmic metal layer 114, a transparent electrode layer 116 is deposited over the epitaxial structure 100. The transparent electrode layer 116 is a layer of conductive material, such as InO, CdSiO, ZnO, MgO, SiO, TiWN or ITO, and preferably ITO.

Finally, a metal pad 118 is formed on the transparent electrode layer 116 to complement an LED device.

Figure 2:
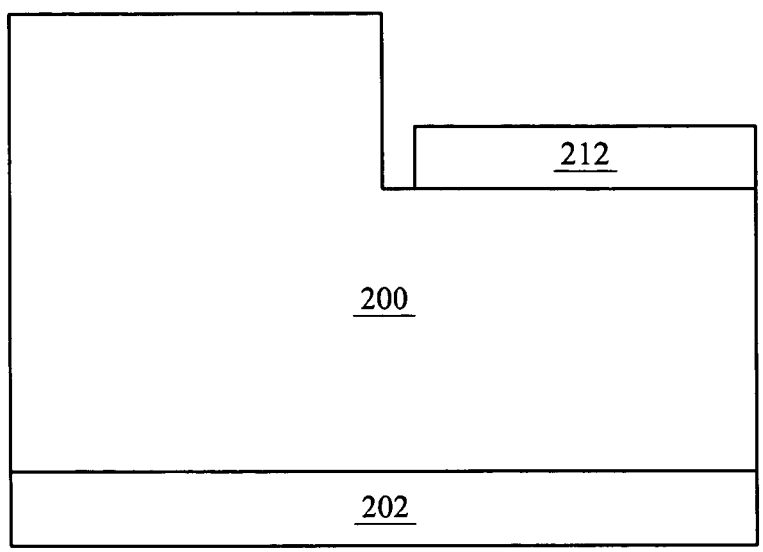
FIGS. 2–2C illustrate a series of cross-sectional structures showing the manufacturing processes for fabricating a transparent electrode of a visible LED in accordance with the second embodiment of the present invention.
Figure 2A:
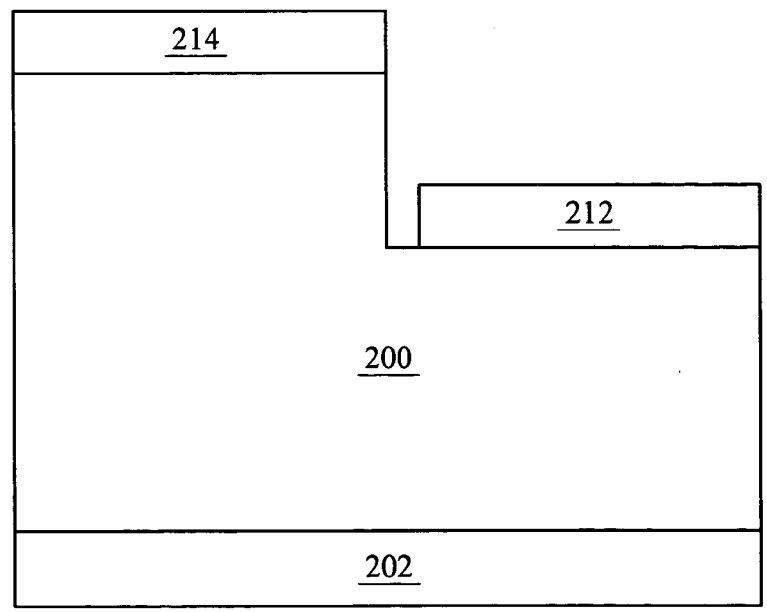
Figure 2B:
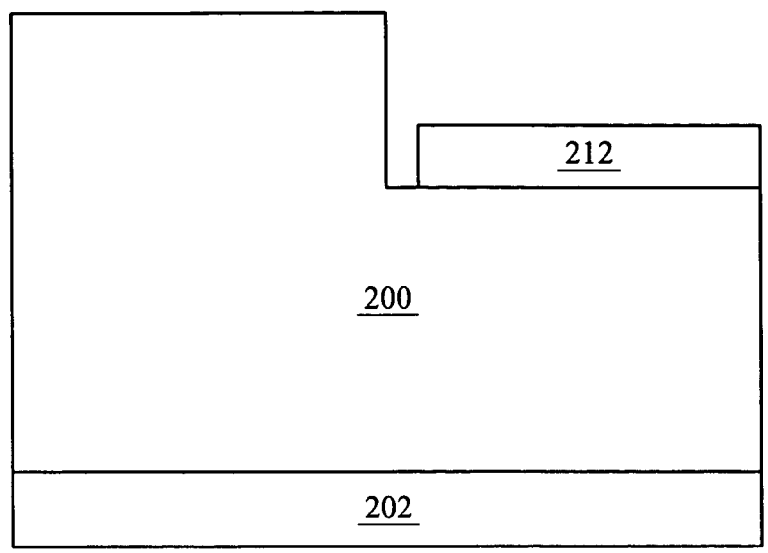
Figure 2C:
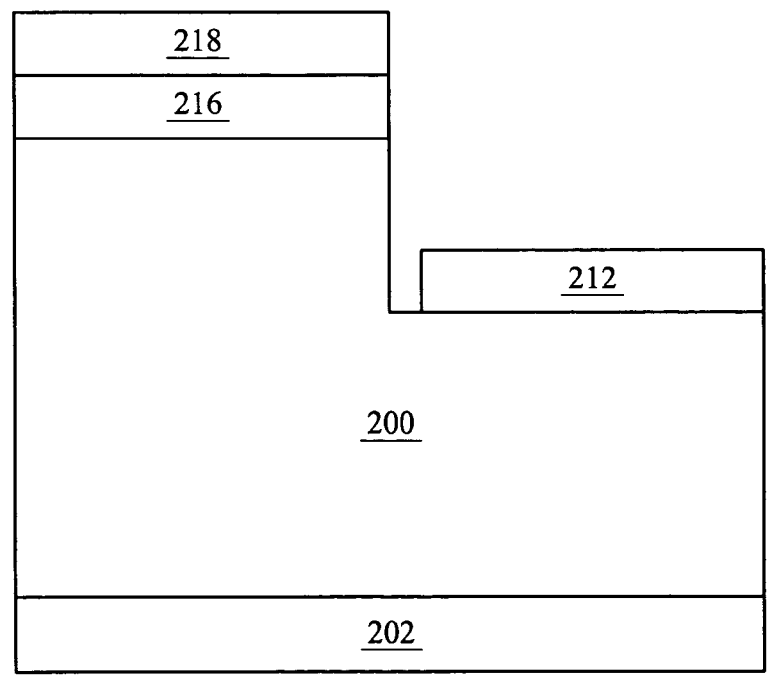

FIGS. 2–2C illustrate a series of cross-sectional structures showing the manufacturing processes for fabricating a transparent electrode of a visible LED in accordance with the second embodiment of the present invention. FIG. 2 illustrates an AlGaInP element comprising a substrate 202 and an epitaxial structure 200 over the substrate 202. In the second embodiment of present invention, the LED element further comprises a metal electrode 212 over a first surface of the epitaxial structure 200. The preferable material of the metal 212 electrode is Ti, Al, or GeAu alloy; and the metal electrode 212 and the epitaxial structure 200 are formed respectively on the same side of the substrate 202.

Generally, the materials used to fabricate the AlGaInP-Based LED element are the same as those used for the AlGaInP-Based LED element described in the first embodiment of present invention, with the exception of the material of substrate 202. The substrate 202 is made of sapphire rather than n-type GaAs. Furthermore, the structures of the first embodiment and the second embodiment are not the same. In the first embodiment of present invention, the metal electrode 112 and the epitaxial structure 100 are formed respectively on opposite sides of the substrate 102. In contrast, in the second embodiment of present invention, the metal electrode 212 and the epitaxial structure 200 are formed respectively on the same side of the substrate 202. In addition the metal electrode 212 is located at least on a portion of the surface of the first surface of epitaxial structure 200.

Referring to FIG. 2, the epitaxial structure 200 comprises a buffer layer, an n-type cladding layer, an active layer, and a p-type cladding layer, formed in sequence. The preferable material of the buffer layer is n-type GaAs. The preferable material of the n-type cladding layer is n-type GaAs with a wider energy gap. The preferable material of the active layer is n-type GaAs with a narrower energy gap or n-type GaAs with multiple quantum wells (MQW). The preferable material of the buffer layer is n-type GaAs. The preferable material of the p-type cladding layer is p-type GaAs with a wider energy gap.

FIG. 2a illustrates a cross-sectional structure of the LED element after the ohmic metal layer 214 is formed over a second surface of the epitaxial structure 200. A suitable process, such as thermal evaporation, electron enhanced evaporation, or sputtering deposition is used to deposit ohmic metal over the epitaxial structure 200. The preferred material of the ohmic metal is PdIn, Zn, Ni, Au, or AuBe alloy. The preferred thickness of the ohmic metal layer 214 is greater than 10 Å. In the second embodiment of present invention, the metal electrode 212 and the ohmic metal layer 214 are formed respectively on the same side of the substrate 202.

Then, a thermal annealing step is conducted on the ohmic metal layer, such that the ohmic metal ions diffuse onto the second surface of the epitaxial structure 200. In the second embodiment of present invention, the annealing temperatures are 200 to 700° C., and more preferably 300 to 500° C. After the annealing step, an etching step is conducted to remove the ohmic metal layer and form the structure illustrated in FIG. 2B.

FIG. 2C illustrates a cross-sectional structure of the LED element after the transparent electrode layer 216 is formed over the second surface of the epitaxial structure 200. After removing the ohmic metal layer 214, a transparent electrode layer 216 is deposited over the second surface of the epitaxial structure 200. The transparent electrode layer 216 is a layer of conductive materials, such as InO, CdSiO, ZnO, MgO, SiO, TiWN or ITO, and preferably ITO.

Finally, a metal pad 218 is formed on the transparent electrode layer 216 to complement an LED device.

Figure 3:
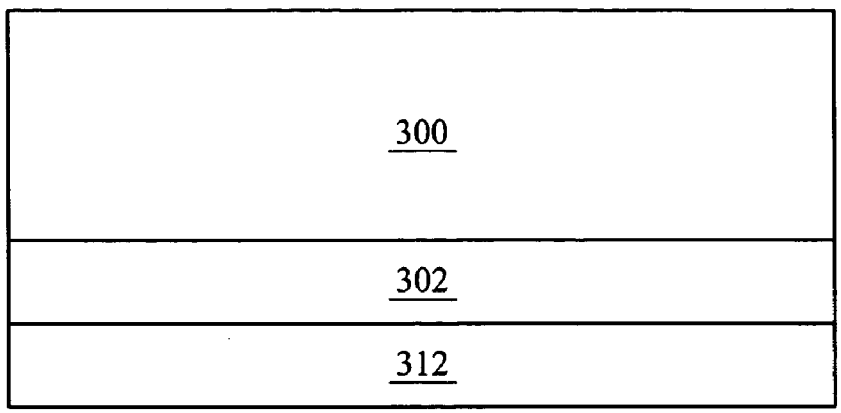
FIGS. 3–3C illustrate a series of cross-sectional structures showing the manufacturing processes for fabricating a transparent electrode of a visible LED in accordance with the third embodiment of the present invention.
Figure 3A:
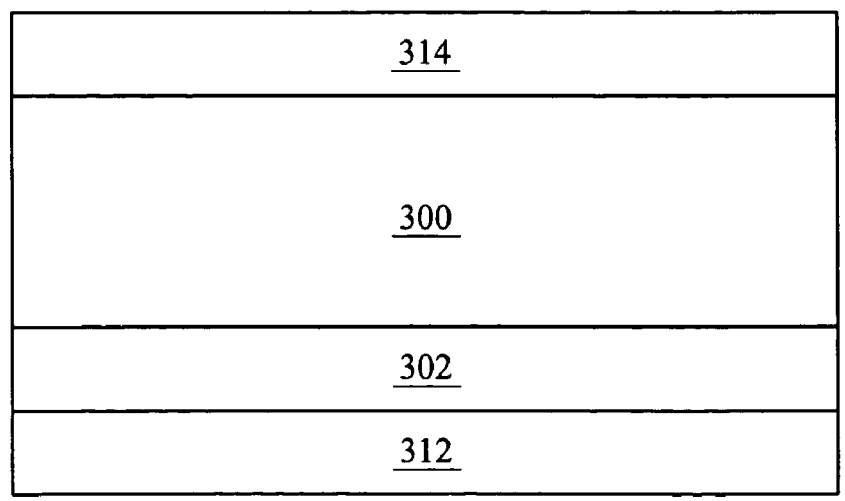
Figure 3B:
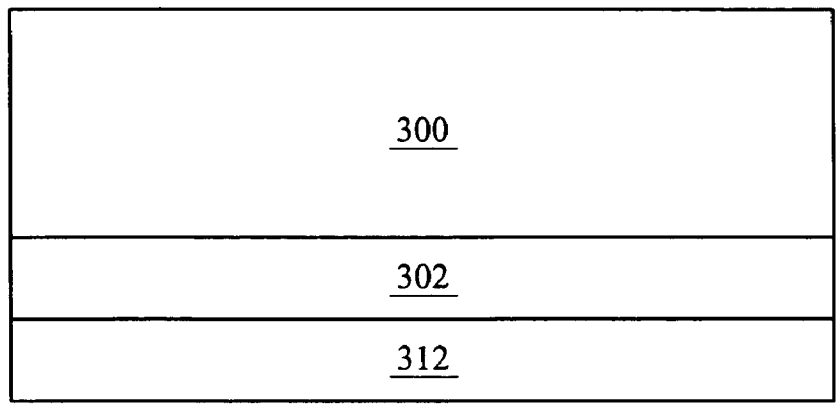
Figure 3C:
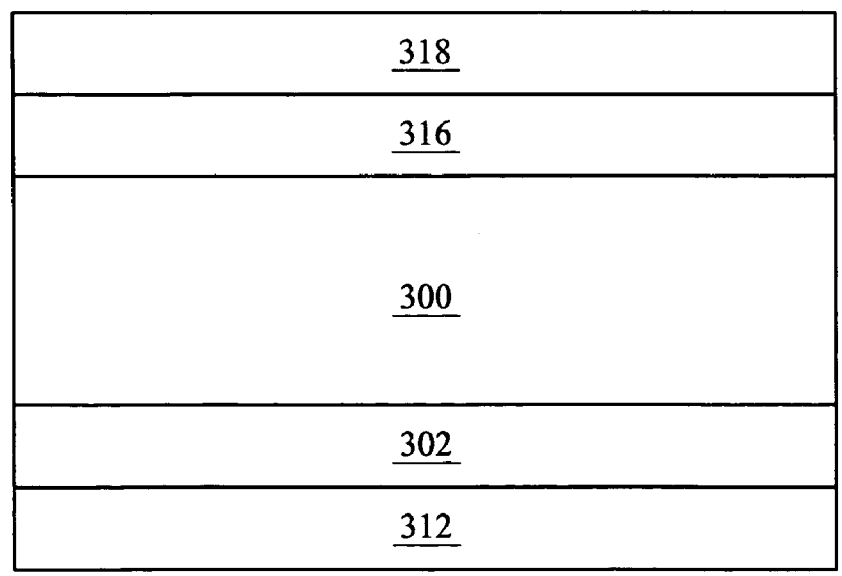

FIGS. 3–3C illustrate a series of cross-sectional structures showing the manufacturing processes for fabricating a transparent electrode of a visible LED in accordance with the third embodiment of the present invention. FIG. 3 illustrates an AlInGaN-based LED element comprising a substrate 302 and an epitaxial structure 300 over the substrate 302. In the embodiment, the substrate 302 is made of n-type GaAs. Generally, the structure of the AlInGaN-based LED element described in the third embodiment of present invention is the same as that of the AlGaInP-based LED described in the first embodiment. The materials of the epitaxial structure used in both embodiments are, however, quite different. In the first embodiment of present invention, the base material of the epitaxial structure 100 is AlGaInP, but in the third embodiment of present invention, the base material of the epitaxial structure 300 is AlInGaN.

Referring to FIG. 3, the epitaxial structure 300 comprises a buffer layer, an n-type cladding layer, an active layer, and a p-type cladding layer deposited in sequence. The preferable material of the buffer layer is n-type GaAs. The preferable material of the n-type cladding layer is n-type GaAs with a wider energy gap. The preferable material of the active layer is n-type GaAs with a narrower energy gap or n-type GaAs with multiple quantum wells (MQW). The preferable material of the buffer layer is n-type GaAs. The preferable material of the p-type cladding layer is p-type GaAs with a wider energy gap.

In the third embodiment of present invention, the LED element further comprises a metal electrode 312. The preferred material of the metal electrode 312 is Ti, Al, or GeAu alloy; and the metal electrode 312 and the epitaxial structure 300 are formed respectively on opposite sides of the substrate 302.

FIG. 3A illustrates a cross-sectional structure of the LED element after the ohmic metal layer 314 is formed over the epitaxial structure 300. A suitable process, such as thermal evaporation, electron enhanced evaporation, or sputtering deposition is used to deposit ohmic metal over the epitaxial structure 300. The preferred material of the ohmic metal is PdIn, Zn, Ni, Au, or AuBe alloy. The preferred thickness of the ohmic metal layer 314 is greater than 10 Å. In the second embodiment of present invention, the metal electrode 312 and the ohmic metal layer 314 are formed respectively on opposite sides of the epitaxial structure 300.

Then, a thermal annealing step is conducted on the ohmic metal layer, such that the ohmic metal ions diffuse onto the surface of the epitaxial structure 300. In the third embodiment of present invention, the annealing temperatures are 200 to 700° C., and more preferably 300 to 500° C. After the annealing step, an etching step is conducted for removing the ohmic metal layer to form the structure illustrated in FIG. 3b.

FIG. 3C illustrates a cross-sectional structure of the LED element after the transparent electrode layer 316 is formed over the epitaxial structure 300. After removing the ohmic metal layer 314, a transparent electrode layer 316 is deposited over the epitaxial structure 300. The transparent electrode layer 316 is a layer of conductive materials, such as InO, CdSiO, ZnO, MgO, SiO, TiWN or ITO, and preferably ITO.

Finally, a metal pad 318 is formed on the transparent electrode layer 316 to complement an LED device.

Figure 4:
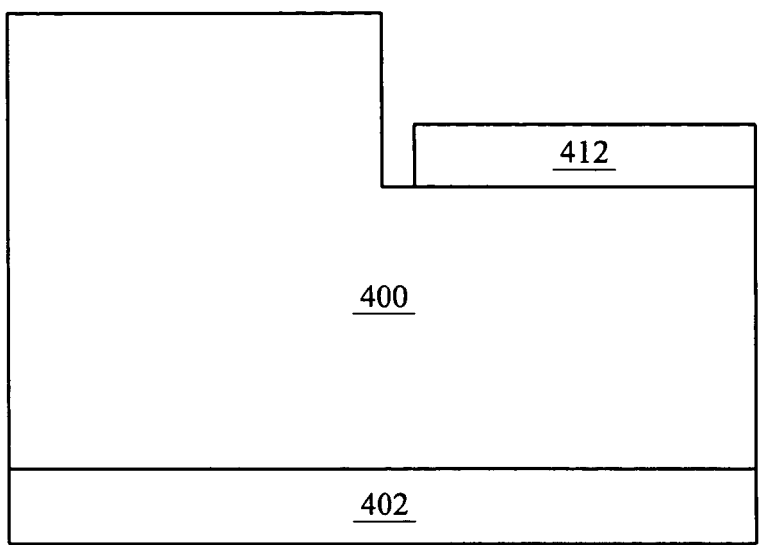
FIGS. 4–4C illustrate a series of cross-sectional structures showing the manufacturing processes for fabricating a transparent electrode of a visible LED in accordance with the fourth embodiment of the present invention.
Figure 4A:
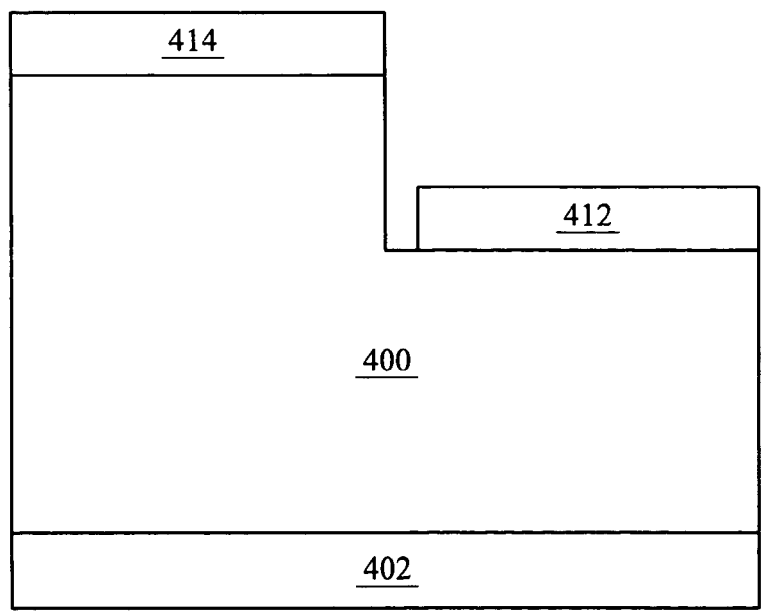
Figure 4B:
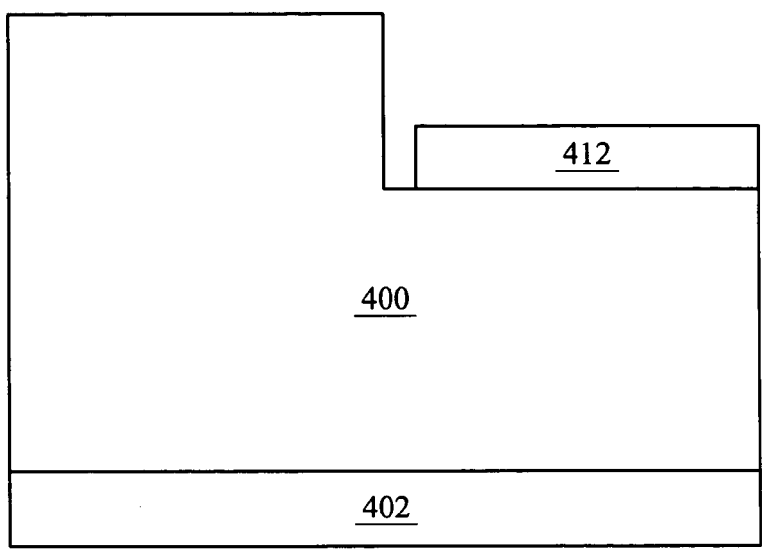
Figure 4C:
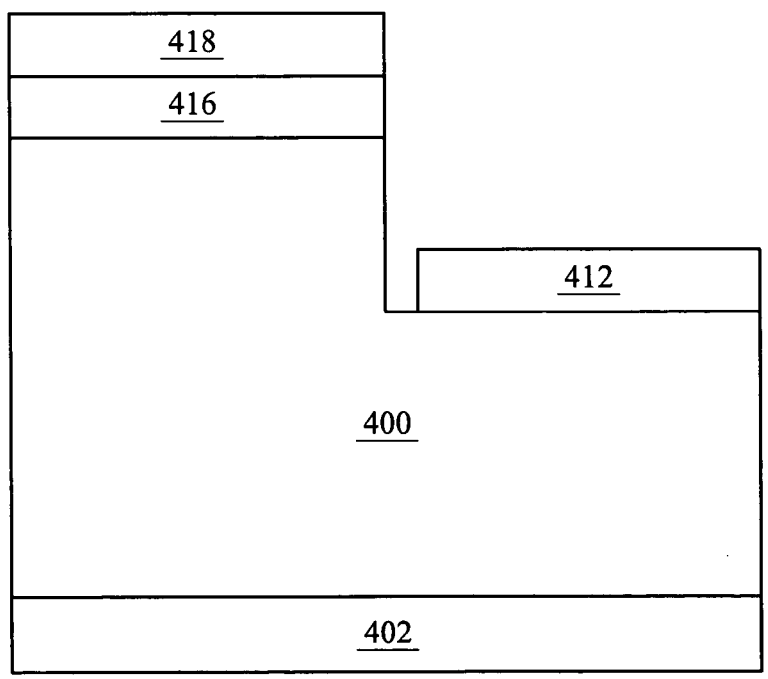

FIGS. 4–4C illustrate a series of cross-sectional structures showing the manufacturing processes for fabricating a transparent electrode of a visible LED in accordance with the fourth embodiment of the present invention. FIG. 4 illustrates an AlInGaN-based element comprising a substrate 402 and an epitaxial structure 400 over the substrate 402. In the fourth embodiment of present invention, the LED element further comprises a metal electrode 412 formed over a first surface of the epitaxial structure 400. The preferable material of the metal electrode 412 is Ti, Al, or GeAu alloy, and the metal electrode 412 and the epitaxial structure 400 are formed respectively on the same side of the substrate 402.

Generally, the materials used for the AlInGaN-based LED element described in the fourth embodiment of present invention are the same as those used for the AlInGaN-based LED element described in the third embodiment, with the exception of the material of substrate 402. The substrate 402 is made of sapphire rather than n-type GaAs. Furthermore, the structures of the third embodiment and the fourth embodiment are not the same. In the third embodiment of present invention, the metal electrode 312 and the epitaxial structure 300 are formed respectively on opposite sides of the substrate 302. In contrast, in the fourth embodiment of present invention, the metal electrode 412 and the epitaxial structure 400 are formed respectively on the same side of the substrate 402. In addition the metal electrode 412 is at least located on portion of the first surface of the epitaxial structure 400.

Referring to FIG. 4, the epitaxial structure 400 comprises a buffer layer, an n-type cladding layer, an active layer, and a p-type cladding layer deposited in sequence. The preferable material of the buffer layer is n-type GaAs. The preferable material of the n-type cladding layer is n-type GaAs with a wider energy gap. The preferable material of the active layer is n-type GaAs with a narrower energy gap or n-type GaAs with multiple quantum wells (MQW). The preferable material of the buffer layer is n-type GaAs. The preferable material of the p-type cladding layer is p-type GaAs with a wider energy gap.

FIG. 4A illustrates a cross-sectional structure of the LED element after the ohmic metal layer 414 is formed over a second surface of the epitaxial structure 400. A suitable process, such as thermal evaporation, electron enhanced evaporation, or sputtering deposition is used to deposit ohmic metal over the second surface of the epitaxial structure 400. The preferred material of the ohmic metal is PdIn, Zn, Ni, Au, or AuBe alloy. The preferred thickness of the ohmic metal layer 414 is greater than 10 Å. In the fourth embodiment of present invention, the metal electrode 412 and the ohmic metal layer 414 are formed respectively on the same side of the substrate 402.

Then, a thermal annealing step is conducted on the ohmic metal layer, such that the ohmic metal ions diffuse onto the second surface of the epitaxial structure 400. In the fourth embodiment of present invention, the annealing temperature is 200 to 700° C., and more preferably 300 to 500° C. After the annealing step, an etching step is conducted for removing the ohmic metal layer to form the structure illustrated in FIG. 4B.

FIG. 4C illustrates a cross-sectional structure of the LED element after the transparent electrode layer 416 is formed over the second surface of the epitaxial structure 400. After removing the ohmic metal layer 414, a transparent electrode layer 416 is deposited over the second surface of the epitaxial structure 400. The transparent electrode layer 416 is a layer of conductive material, such as InO, CdSiO, ZnO, MgO, SiO, TiWN or ITO, and preferably ITO.

Finally, a metal pad 418 is formed on the transparent electrode layer 416 to complement an LED device.

Figure 5:
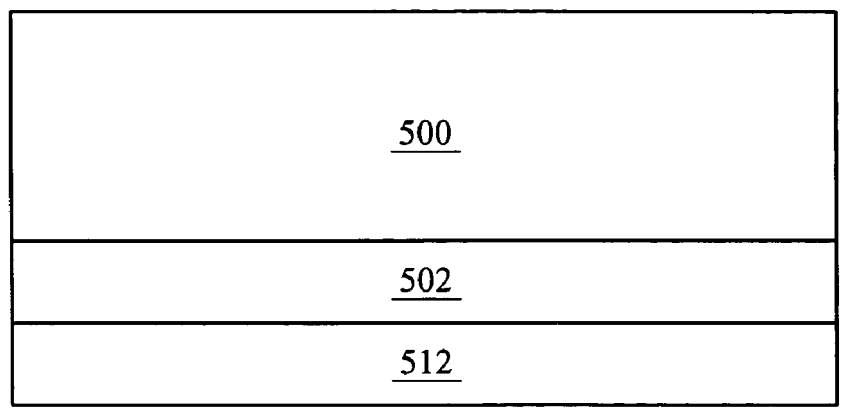
FIGS. 5–5C illustrate a series of cross-sectional structures showing the manufacturing processes for fabricating a transparent electrode of a visible LED in accordance with the fifth embodiment of the present invention.
Figure 5A:
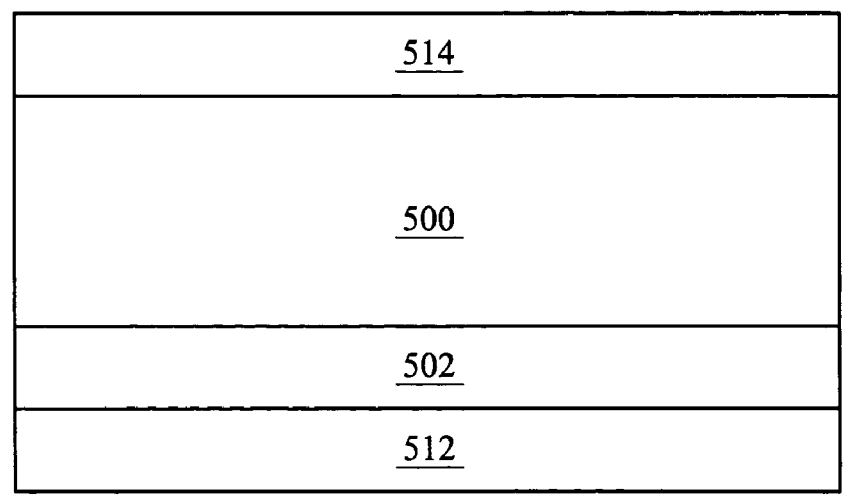
Figure 5B:
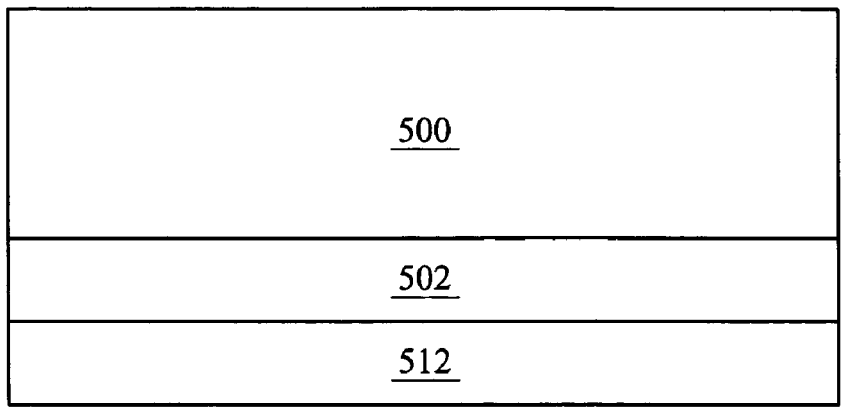
Figure 5C:
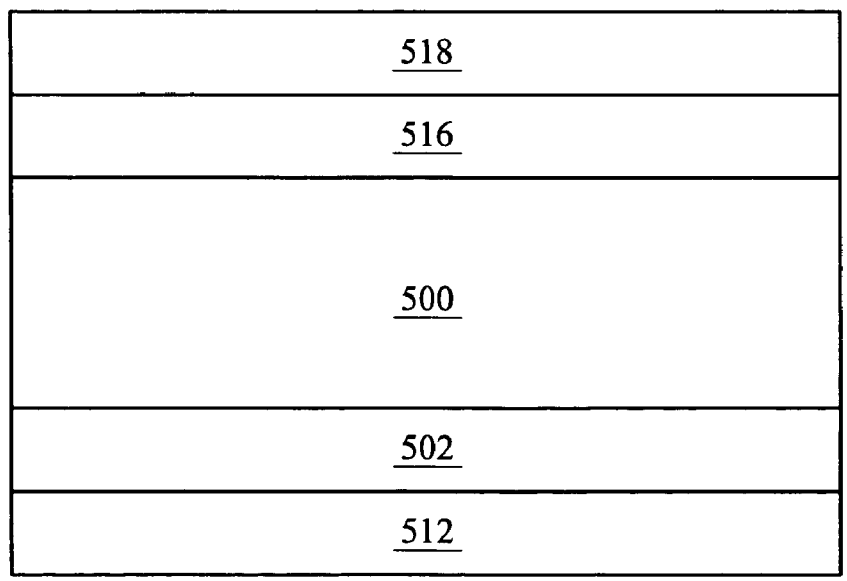

FIG. 5 to FIG. 5C illustrate a series of cross-sectional structures showing the manufacturing processes for fabricating a transparent electrode of a visible LED in accordance with the third embodiment of the present invention. FIG. 5 illustrates an MgZnSSe-based LED element comprising a substrate 502 and an epitaxial structure 500 over the substrate 502. In the embodiment, the substrate 502 is made of n-type GaAs. Generally, the epitaxial structure 500 used to build the MgZnSSe-based LED element described in the fifth embodiment of present invention is the same as the epitaxial structure 100 described in the first embodiment. But the materials of the epitaxial structure used in both embodiments are quite different. In the first embodiment of present invention, the base material of the epitaxial structure 100 is AlGaInP, but in the fifth embodiment of present invention, the base material of the epitaxial structure 500 is MgZnSSe.

Referring to FIG. 5, the epitaxial structure 500 comprises a buffer layer, an n-type cladding layer, an active layer, and a p-type cladding layer, deposited in sequence. The preferable material of the buffer layer is n-type GaAs. The preferable material of the n-type cladding layer is n-type GaAs with a wider energy gap. The preferable material of the active layer is n-type GaAs with a narrower energy gap or n-type GaAs with multiple quantum wells (MQW). The preferable material of the buffer layer is n-type GaAs. The preferable material of the p-type cladding layer is p-type GaAs with a wider energy gap.

In the fifth embodiment of present invention, the LED element further comprises a metal electrode 512. The preferred material of the metal electrode 512 is Ti, Al, or GeAu alloy, and the metal electrode 512 and the epitaxial structure 500 are formed respectively on opposite sides of the substrate 502.

FIG. 5a illustrates a cross-sectional structure of the LED element after the ohmic metal layer 514 is formed over the epitaxial structure 500. A suitable process, such as thermal evaporation, electron enhanced evaporation, or sputtering deposition is used to deposit ohmic metal over the epitaxial structure 500. The preferred material of the ohmic metal may be PdIn, Zn, Ni, Au, or AuBe alloy. The preferred thickness of the ohmic metal layer 514 is greater than 10 Å. In the second embodiment of present invention, the metal electrode 512 and the ohmic metal layer 514 are formed respectively on opposite sides of the epitaxial structure 500.

Then, a thermal annealing step is conducted on the ohmic metal layer, such that the ohmic metal ions diffuse onto the surface of the epitaxial structure 500. In the third embodiment of present invention, the annealing temperature is 200 to 700° C., and more preferably 300 to 500° C. After the annealing step, an etching step is conducted for removing the ohmic metal layer to form the structure illustrated in FIG. 5B.

FIG. 5C illustrates a cross-sectional structure of the LED element after the transparent electrode layer 516 is formed over the epitaxial structure 500. After removing the ohmic metal layer 514 a transparent electrode layer 516 is deposited over the epitaxial structure 500. The transparent electrode layer 516 is a layer of conductive materials, such as InO, CdSiO, ZnO, MgO, SiO, TiWN or ITO, and preferably ITO.

Finally, a metal pad 518 is formed on the transparent electrode layer 516 to complement an LED device.

Figure 6:
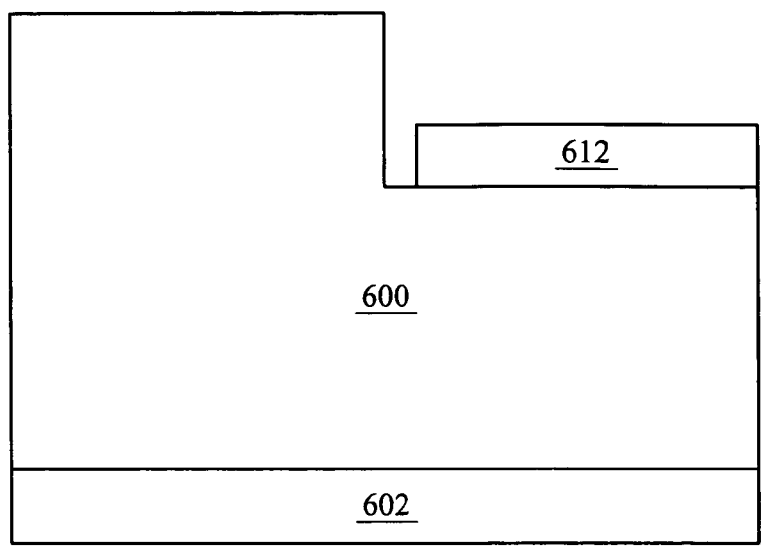
FIGS. 6–6C illustrate a series of cross-sectional structures showing the manufacturing processes for fabricating a transparent electrode of a visible LED in accordance with the sixth embodiment of the present invention.
Figure 6A:
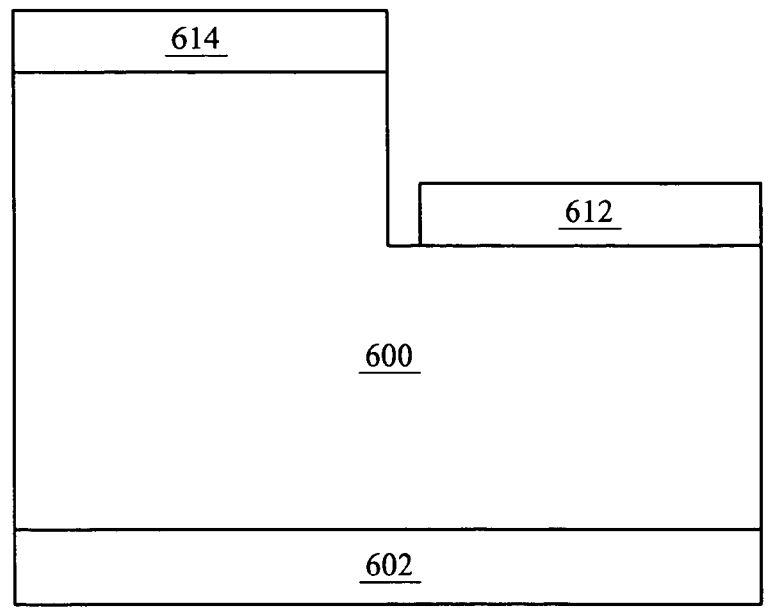
Figure 6B:
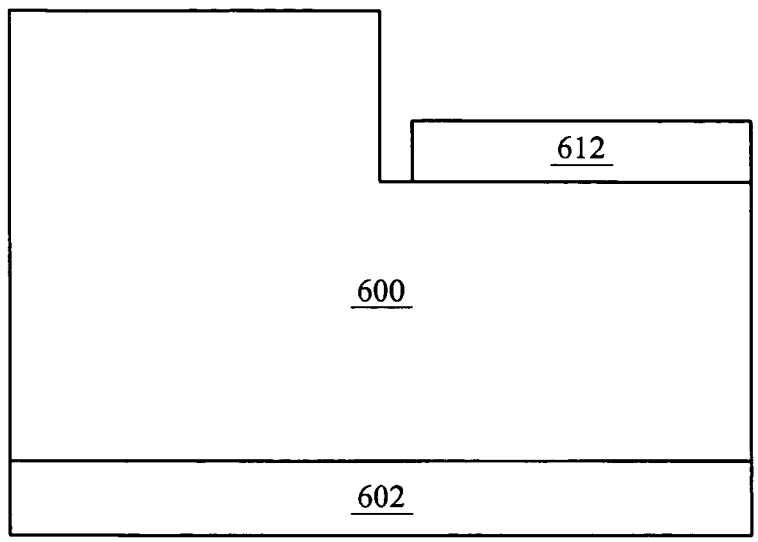
Figure 6C:
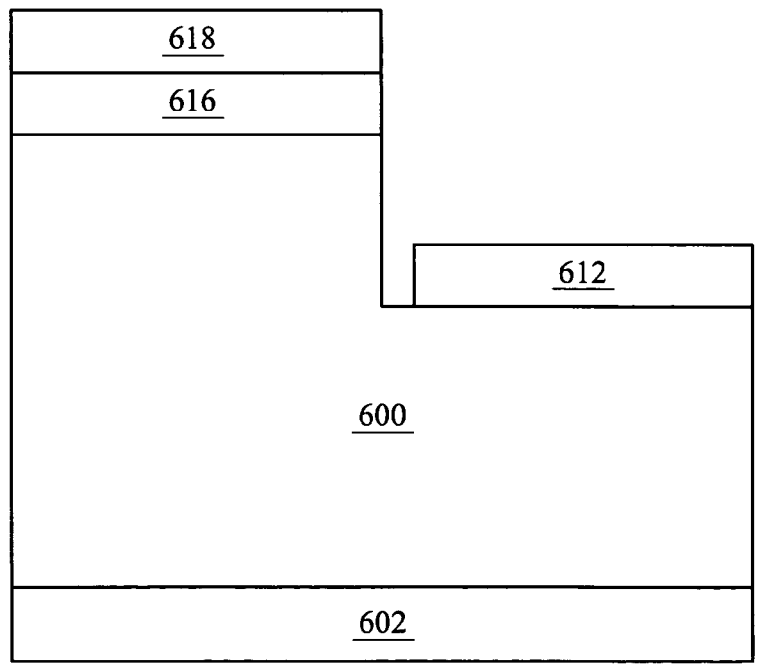

Referring to FIG. 6 to FIG. 6c illustrate a series of cross-sectional structures showing the manufacturing processes for fabricating a transparent electrode of a visible LED in accordance with the fourth embodiment of the present invention. FIG. 6 illustrates an MgZnSSe-based element comprising a substrate 602 and an epitaxial structure 600 over the substrate 602. In the fourth embodiment of present invention, the LED element further comprises a metal electrode 612 formed over a first surface of the epitaxial structure 600. The preferable material of the metal electrode 612 is Ti, Al, or GeAu alloy, and the metal electrode 612 and the epitaxial structure 600 are formed respectively on the same side of the substrate 602.

Generally, the material of the MgZnSSe-based LED element described in the sixth embodiment of present invention is the same as the MgZnSSe-Based LED element described in the fifth embodiment, with the exception of the material of substrate 602. The substrate 602 is made of sapphire rather than n-type GaAs. Furthermore, the structures of the sixth embodiment and the fifth embodiment are not the same. In the fifth embodiment of present invention, the metal electrode 512 and the epitaxial structure 500 are formed respectively on opposite sides of the substrate 502. In contrast, in the sixth embodiment of present invention, the metal electrode 612 and the epitaxial structure 600 are formed respectively on the same side of the substrate 602. In addition, the metal electrode 612 is at least located on portion of the first surface of the epitaxial structure 600.

Referring to FIG. 6, the epitaxial structure 600 comprises a buffer layer, an n-type cladding layer, an active layer, and a p-type cladding layer, deposited in sequence. The preferable material of the buffer layer is n-type GaAs. The preferable material of the n-type cladding layer is n-type GaAs with a wider energy gap. The preferable material of the active layer is n-type GaAs with a narrower energy gap or n-type GaAs with multiple quantum wells (MQW). The preferable material of the buffer layer is n-type GaAs. The preferable material of the p-type cladding layer is p-type GaAs with a wider energy gap.

FIG. 6A illustrates a cross-sectional structure of the LED element after the ohmic metal layer 614 is formed over the second surface of the epitaxial structure 600. A suitable process, such as thermal evaporation, electron enhanced evaporation, or sputtering deposition is used to deposit ohmic metal over the second surface of the epitaxial structure 600. The preferred material of the ohmic metal is PdIn, Zn, Ni, Au, or AuBe alloy. The preferred thickness of the ohmic metal layer 614 is greater than 10 Å. In the sixth embodiment of present invention, the metal electrode 612 and the ohmic metal layer 614 are formed respectively on the same side of the substrate 602.

Then, a thermal annealing step is conducted on the ohmic metal layer, such that the ohmic metal ions diffuse onto the second surface of the epitaxial structure 600. In the sixth embodiment of present invention, the annealing temperature is 200 to 700° C., and more preferably 300 to 500° C. After the annealing step, an etching step is conducted for removing the ohmic metal layer to form the structure illustrated in FIG. 6B.

FIG. 6C illustrates a cross-sectional structure of the LED element after the transparent electrode layer 616 is formed over the second surface of the epitaxial structure 600. After removing the ohmic metal layer 614, a transparent electrode layer 616 is deposited over the second surface of the epitaxial structure 600. The transparent electrode layer 616 is a layer of conductive materials, such as InO, CdSiO, ZnO, MgO, SiO, TiWN or ITO, and preferably ITO.

Finally, a metal pad 618 is formed on the transparent electrode layer 616 to complement an LED device.

Accordingly, the method provided by present invention utilized thermal annealing to diffuse ohmic metal ions onto the surface of the epitaxial structure, thereby reducing the resistance between the transparent electrode and the visible LED element. Additionally, the method avoids the problems of visible light absorption.

As is understood by a person skilled in the art, the foregoing preferred embodiments of the present invention are illustrated of the present invention rather than limiting of the present invention. It is intended to cover various modifications and similar arrangements; for example the various structures known in the art and any materials within the range of the energy gap (1.36 eV to 3.26 eV) are included within the spirit and scope of the appended claims, the scope of which should be accorded the broadest interpretation so as to encompass all such modifications and similar structure.

What is claimed is:

1. A method for fabricating a transparent electrode of a visible LED, comprising:
    providing a visible LED element, comprising a substrate, an epitaxial structure, and a metal electrode, wherein the metal electrode and the epitaxial structure are formed on opposite sides of the substrate;
    forming an ohmic metal layer over a surface of the epitaxial structure;
    thermal annealing the ohmic metal layer;
    removing the ohmic metal layer to expose the surface of the epitaxial structure that is contact with the entire ohmic metal layer;
    forming a transparent electrode layer over the surface of the epitaxial structure; and
    forming a metal pad over the transparent electrode layer.

2. The method according to claim 1, wherein a material of the epitaxial structure is selected from a he group consisting of Ill -V semiconductor materials with energy gaps of about 1.36 eV to 3.26 eV.

3. The method according to claim 2, wherein a material of the epitaxial structure is selected from a group consisting of AIGaInP, AIInGaN, and MgZnSSe.

4. The method according to claim 1, wherein a thickness of the ohmic metal layer is greater than about 10 Å.

5. The method according to claim 1, wherein an annealing temperatures about 200 to 700° C.

6. The method according to claim 1, wherein an annealing temperature is about 200 to 500° C.

7. The method according to claim 1, wherein the ohmic metal layer is removed by a wet etching process.

8. The method according to claim 1, wherein the transparent electrode layer is made of a conductive material, wherein the conductive material is selected from a group consisting of InO, CdSiO, ZnO, MgO, SiO, TIWN and ITO.

9. The according to claim 8, wherein the conductive material is selected from a group consisting of ITO and ZnO.

10. The method according to claim 1, wherein the metal electrode comprises Al, Ti or GeAu alloy.

11. The method according to claim 1, wherein the ohmic metal layer comprises PdIn, Zn, Ni, Au, or AuBe alloy.

* * * * *